US010923248B2

(12) United States Patent
De Boer et al.

(10) Patent No.: US 10,923,248 B2
(45) Date of Patent: *Feb. 16, 2021

(54) METHOD FOR PRODUCING A METAL FILM

(71) Applicant: VDM Metals International GmbH, Werdohl (DE)

(72) Inventors: Nicole De Boer, Altena (DE); Stefan Gilges, Altena (DE); Heike Hattendorf, Werdohl (DE); Andreas Heckmann, Dortmund (DE)

(73) Assignee: VDM Metals International GmbH, Werdohl (DE)

( * ) Notice: Subject to any disclaimer, the term of this patent is extended or adjusted under 35 U.S.C. 154(b) by 629 days.

This patent is subject to a terminal disclaimer.

(21) Appl. No.: 14/787,159

(22) PCT Filed: Jun. 6, 2014

(86) PCT No.: PCT/DE2014/000282
§ 371 (c)(1),
(2) Date: Oct. 26, 2015

(87) PCT Pub. No.: WO2014/194880
PCT Pub. Date: Dec. 11, 2014

(65) Prior Publication Data
US 2016/0071632 A1 Mar. 10, 2016

(30) Foreign Application Priority Data
Jun. 7, 2013 (DE) .................. 10 2013 009 575

(51) Int. Cl.
| | |
|---|---|
| *C22F 1/10* | (2006.01) |
| *C22C 19/05* | (2006.01) |
| *H01B 13/00* | (2006.01) |
| *C22C 19/03* | (2006.01) |
| *C22C 1/02* | (2006.01) |
| *H01L 39/24* | (2006.01) |
| *B22D 7/00* | (2006.01) |
| *B22D 11/00* | (2006.01) |
| *B22D 21/02* | (2006.01) |
| *B23K 31/02* | (2006.01) |
| *C22F 1/00* | (2006.01) |
| *C22F 1/02* | (2006.01) |
| *H01B 12/06* | (2006.01) |

(52) U.S. Cl.
CPC ............ *H01B 13/00* (2013.01); *B22D 7/005* (2013.01); *B22D 11/001* (2013.01); *B22D 21/025* (2013.01); *B23K 31/02* (2013.01); *C22C 1/023* (2013.01); *C22C 19/03* (2013.01); *C22C 19/057* (2013.01); *C22C 19/058* (2013.01); *C22F 1/002* (2013.01); *C22F 1/02* (2013.01); *C22F 1/10* (2013.01); *H01B 12/06* (2013.01); *H01L 39/2454* (2013.01)

(58) Field of Classification Search
CPC ......... C22C 1/023; C22C 19/03; C22C 19/05; C22C 19/051; C22C 19/052; C22C 19/053; C22C 19/055; C22C 19/056; C22C 19/057; C22C 19/058; C22F 1/00; C22F 1/002; C22F 1/02; C22F 1/10
See application file for complete search history.

(56) References Cited

U.S. PATENT DOCUMENTS

| | | |
|---|---|---|
| 3,220,891 A | 11/1965 | Templeton et al. |
| 5,783,145 A | 7/1998 | Coutu et al. |
| 5,919,319 A | 7/1999 | Couderchon |
| 5,964,966 A | 10/1999 | Goyal et al. |
| 5,985,220 A | 11/1999 | Hughes |
| 6,447,714 B1 | 9/2002 | Goyal et al. |
| 6,663,730 B2 | 12/2003 | Coutu |

(Continued)

FOREIGN PATENT DOCUMENTS

| | | |
|---|---|---|
| CN | 1740357 A | 3/2006 |
| CN | 101680058 A | 3/2010 |

(Continued)

OTHER PUBLICATIONS

Egbert Baake, Introduction section of "Components, Design, and Operation of Vacuum Induction Crucible Furnaces," Induction Heating and Heat Treatment, vol. 4C, ASM Handbook, ASM International, 2013, pp. 462-466 (print), pp. 1-2 (online version). (Year: 2013).*
D.J. Tillack, J.M. Manning, J.R. Hensley, Annealing section of "Heat Treating of Nickel and Nickel Alloys," Heat Treating, vol. 4, ASM Handbook, ASM International, 1991, pp. 907-912 (print), pp. 1-4 (online version). (Year: 1991).*
International Search Report of PCT/DE2014/000282, dated Dec. 1, 2014.
International Search Report of PCT/DE2014/000283, dated Dec. 1, 2014.
Sarma et al, Recrystallisation texture and magnetisation behaviour of some FCC Ni—W alloys, Scripta Materialia, Elsevier, Amsterdam, NL, vol. 50, No. 7, Apr. 1, 2004, pp. 953-957.

(Continued)

*Primary Examiner* — Vanessa T. Luk
(74) *Attorney, Agent, or Firm* — Collard & Roe, P.C.

(57) ABSTRACT

A method for producing a metal film from an over 50% nickel alloy melts more than one ton of the alloy in a furnace, followed by VOD or VLF system treatment, then pouring off to form a pre-product, followed by re-melting by VAR and/or ESU. The pre-product is annealed 1-300 hours between 800 and 1350° C. under air or protection gas, then hot-formed between 1300 and 600° C., such that the pre-product then has 1-100 mm thickness after the forming and is not recrystallized, recovered, and/or (dynamically) recrystallized having a grain size below 300 μm. The pre-product is pickled, then cold-formed to produce a film having 10-600 μm end thickness and a deformation ratio greater than 90%. The film is cut into 5-300 mm strips, annealed 1 second to 5 hours under protection gas between 600 and 1200° C. in a continuous furnace, then recrystallized to have a high cubic texture proportion.

8 Claims, No Drawings

(56) References Cited

U.S. PATENT DOCUMENTS

| | | | |
|---|---|---|---|
| 6,692,992 B1 | 2/2004 | Cozar et al. | |
| 7,048,813 B2 | 5/2006 | Miyazaki | |
| 7,950,124 B2 * | 5/2011 | Stuth | B23K 9/00 228/176 |
| 8,465,605 B2 | 6/2013 | Eickemeyer et al. | |
| 2004/0238085 A1 * | 12/2004 | Eickemeyer | B21C 1/003 148/676 |
| 2007/0062613 A1 | 3/2007 | Eickemeyer et al. | |
| 2009/0008000 A1 * | 1/2009 | Eickemeyer | C22F 1/10 148/676 |
| 2010/0000637 A1 * | 1/2010 | Hatano | C22F 1/00 148/685 |
| 2010/0059145 A1 | 3/2010 | Hattendorf et al. | |
| 2010/0099573 A1 * | 4/2010 | Aoki | C22C 5/06 505/230 |
| 2012/0073712 A1 | 3/2012 | Dewobroto et al. | |

FOREIGN PATENT DOCUMENTS

| | | | |
|---|---|---|---|
| DE | 2816173 A1 | | 10/1979 |
| DE | 19904951 A1 * | 8/2000 | C22C 19/03 |
| DE | 697 06 083 T2 | | 3/2002 |
| DE | 103 42 965 A1 | | 6/2005 |
| DE | 10 2005 013 368 B3 | | 4/2006 |
| DE | 10 2004 060 900 A1 | | 6/2006 |
| DE | 10 2008 016 222 A1 | | 11/2008 |
| DE | 10 2011 015 961 A1 | | 10/2012 |
| EP | 1 208 244 B1 | | 5/2004 |
| JP | 2002-541321 A | | 12/2002 |
| JP | 2004-514056 A | | 5/2004 |
| JP | 2007-115561 A | | 5/2007 |
| JP | 2009-245888 A | | 10/2009 |
| JP | 2010-525156 A | | 7/2010 |
| JP | 2012-523493 A | | 10/2012 |
| JP | 2013-104126 A | | 5/2013 |
| KR | 2009-0130055 A | | 12/2009 |
| WO | 2012/136181 A2 | | 10/2012 |

OTHER PUBLICATIONS

Mincu et al, Refining Steels Produced in Electric Arc Furnace, U.P.B. Sci. Bull, Series B, vol. 75, Iss. 2, 2013, 2 pages.
Inteco special melting technologies, p. 4/8, www.inteco.at/produkte/sekundaermetallurgic, 13 pages downloaded Sep. 8, 2015.
Wikipedia, Surface roughness, downloaded Nov. 9, 2018 (4 pages).
Rzehak, Beschleunigte Entkohlung von Stahlschmeizen im Vakuum durch Kombination von Sauerstoff und Metalloxiden, Von der Fakultät für Georessourcen und Materialtechnik der Rheinisch-Westfällschen Technischen Hochschule Aachen, Jan. 23, 2013, pp. 1-18 (with English translation of relevant portions).

* cited by examiner

METHOD FOR PRODUCING A METAL FILM

CROSS REFERENCE TO RELATED APPLICATIONS

This application is the National Stage of PCT/DE2014/000282 filed on Jun. 6, 2014, which claims priority under 35 U.S.C. § 119 of German Application No. 10 2013 009 575.1 filed on Jun. 7, 2013, the disclosure of which is incorporated by reference. The international application under PCT article 21(2) was not published in English.

The invention relates to a method for the production of a metal foil from an alloy that contains more than 50% nickel, especially a method for the production of a metal foil that consists substantially of nickel and tungsten at the surface.

During hot-forming (e.g. ingot and slab rolling), very pure nickel alloys are susceptible to material defects, such as cracks and breaks, especially in the case in which a cast ingot (e.g. VIM) is additionally remelted (e.g. VAR).

For special applications, such as e.g. superconducting tapes, very pure alloys in the form of thin foils exhibiting defect-free surfaces and a high percentage of cubic texture are needed. Heretofore it has not been possible to manufacture these at reasonable costs with conventional industrial-scale production processes. The task consists in manufacturing such a foil with conventional industrial-scale production processes at reasonable costs. Heretofore this has not been possible.

DE 697 06 083 T2 relates to an iron-nickel alloy of the following chemical composition (in wt %)
30%≤Ni+Co≤85%
0%≤Co+Cu+Mn≤10%
0%≤Mo+W+Cr≤4%
0%≤V+Si≤2%
0%≤Nb+Ta≤1%
0.003%≤C≤0.05%
0.003%≤Ti≤0.15%
0003%≤Ti+Zr+Hf≤0.15%
0.001%<S+Se+Te<0.015%
Mg<0.001%
Ca<0.0025%
Al≤0.05%
O<0.0025%
N<0.005%
P<0.01%
Sc+Y+La+Ce+Fe+Nd+Sm<0.01%,
wherein the rest is iron and impurities originating from smelting, wherein the chemical composition additionally satisfies the relationship: 0%≤Nb+Ta+Ti+Al≤1%.

That publication also discloses a method for the production, from this alloy, of a cold-rolled strip that exhibits a cubic texture, wherein a hot-rolled strip is produced, this strip is cold-rolled with a degree of deformation of greater than 80%, the cold-rolled strip is annealed at a temperature that is higher than 550° C. and lower than the temperature of the secondary recrystallization of the alloy, in order to impart a cubic texture thereto.

DE 10 2008 016 222 A1 has disclosed a metal foil with (in wt %)
Ni 74-90%
W 10-26% as well as
Al and/or Mg and/or B in contents of
Al>0 to max. 0.02%
Mg>0 to max. 0.025%
B>0 to max. 0.005%

The material can be produced on the industrial scale of greater than 1 metric ton by melting metallurgy and is capable of exhibiting a recrystallization cubic texture upon appropriate treatment. A method for production by melting metallurgy is indeed cited here, but further process control with which the desired properties can be established cost-effectively is not disclosed.

This metal foil may be used as metal tape for epitactic coatings.

DE 2816173 discloses a method for the manufacture of toroidal cores. Therein wound strips of an Ni alloy are subjected to a heat treatment between 900-1050° C. Hereby a cubic texture can be established. The method is applied to NiFeMo alloys with 63 to 65.5 wt % nickel, 2 to 4 wt % molybdenum, the rest iron. Alloys on the basis of NiW are not mentioned here.

DE 102004060900 discloses a semifinished product of pure Ni or of an Ni alloy with an alloying element of the Sc, Y, La, Ac group, which product is transformed into a cubic texture by rolling and heat treatment. Alloys on the basis of NiW are explicitly stated here to be unsuitable for epitactic coating. A specific method of the heat treatment is not disclosed here.

DE 102005013368 discloses a method for the production of a semifinished product that can be used for physicochemical coating with superconducting layers. No method usable for industrial-scale production is disclosed here.

The task of the invention is to provide a novel method for the production of substrate tape for high-temperature superconductors, by means of which amounts >1 metric ton can be processed economically.

This task is accomplished by a method for the production of a metal foil from an alloy with more than 50% nickel, containing the following method steps:

(a) the alloy is melted in amounts of more than one metric ton in a vacuum induction furnace or openly in an induction or arc furnace, followed by a treatment in a VOD or VLF system, (b) then the alloy is cast into ingots, electrodes or as continuous casting for the formation of a primary product, if necessary followed by a single or multiple remelting by means of VAR and/or ESU (c) thereafter the primary product is annealed as needed at temperatures between 800 and 1350° C. for 1 hour to 300 hours under air or shielding gas, (d) thereafter the primary product is hot-formed, especially hot-rolled, at temperatures between 1300 and 600° C., wherein the thickness of the starting material is reduced by the factor of 1.5-200, so that the primary product has a thickness of 1 to 100 mm after the forming and has not been recrystallized and/or annealed out and/or has been (dynamically) recrystallized with a grain size smaller than 300 µm, especially smaller than 100 µm or smaller than 70 µm, (e) the primary product is then pickled, (f) thereafter the primary product is cold-worked with a degree of deformation of greater than 90% for the production of a foil with a final thickness of 10 to 600 µm, especially of 40 to 150 µm, (g) subsequent to the cold-forming, the foil is cut into strips of 5 to 300 mm, (h) the foil strips are then annealed under shielding gas at temperatures between 600 and 1200° C. for 1 second to 5 hours in the continuous furnace, (i) wherein the annealed foil-like material is recrystallized and exhibits a large proportion of cubic texture after this annealing.

Advantageous improvements of the method according to the invention can be found in the associated dependent method-related claims.

A metal foil produced by the method according to the invention consists advantageously of (in wt %)

W 5 to 30%
Mg 0.0001 to 0.050%
Ni the rest as well as the usual smelting-related impurities, wherein W can be replaced completely or partly by Mo if necessary and Mg completely or partly by Ca if necessary.

Advantageous improvements of the metal foil can be found in the associated dependent claims related to the subject matter.

If necessary, the metal foil may also contain the following elements:
Ti max. 0.10%
Al max. 0.10%
B max. 0.020%
Fe max. 1.0%
Co max. 1.0%
Mn max. 0.20%
Si max. 0.20%
Cr, Cu, Nb respectively max. 0.20%
P max. 0.020%
C max. 0.050%
N max. 0.020%
S max. 0.020%.

Beyond this, the possibility exists of adjusting the elements below as follows in the alloy:
Mg 0.0001-0.020%,
Ti 0.001 to 0.050%
Al 0.001 to 0.050%
B max. 0.010%
Fe max. 1.0%
Co max. 1.0%
Mn max. 0.05%
Si max. 0.10%
Cr, Cu, Nb, V, Ta respectively max. 0.10%
P max. 0.010%
C max. 0.030%
N max. 0.010%
S max. 0.010%
O max. 0.030%
Ni the rest.

It is of advantage when the alloy is melted in amounts of more than one metric ton in a vacuum induction furnace or openly in an induction or arc furnace, followed by a treatment in a VOD or VLF system, then the alloy is cast into ingots, electrodes or as continuous casting for the formation of a primary product, thereafter the primary product is additionally annealed at temperatures between 800 and 1350° C. for 1 hour to 300 hours under air or shielding gas, followed by a single or multiple remelting by means of VAR and/or ESU.

It is likewise advantageous when the primary product, which is hot-rolled at temperatures between 1300° C. and 600° C., wherein the thickness of the starting material is reduced by the factor of 1.5-200, so that the primary product has a thickness of 1 to 100 mm after the rolling and has not been recrystallized and/or annealed out and/or has been (dynamically) recrystallized with a grain size smaller than 300 μm, thereafter is additionally hot-rolled a 2nd time and if necessary also a 3rd time at temperatures between 1300° C. and 600° C. after an annealing at temperatures between 800 and 1350° C. for 1 hour to 300 hours under air or shielding gas, wherein the thickness of the starting material is reduced by the factor of 1.5 to 200 and after the last rolling has a thickness of 1 to 100 mm and has not been recrystallized and/or has been annealed out and/or has been (dynamically) recrystallized with a grain size smaller than 300 μm, especially smaller than 100 μm or smaller than 70 μm respectively.

Beyond this, the possibility exists of grinding the primary product after the hot-rolling(s) and the subsequent pickling.

Furthermore, after the pickling and/or grinding, the production of a foil of the final thickness of 10 to 300 μm with a degree of deformation greater than 90% can take place by cold-working with rolls having well-defined surface for the establishment of roughnesses smaller than 2 μm.

According to a further idea of the invention, after the pickling and/or grinding, the production of a foil of the final thickness of 10 to 300 μm with a degree of deformation greater than 90% can take place by cold-working with intermediate annealings at temperatures between 550° C. and 1200° C. and annealing times for the material between 10 seconds and 100 hours under air or reducing shielding gas, wherein the shielding gas can consist of hydrogen or a hydrogen/nitrogen mixture or argon or a mixture of these gases, followed by a quenching in stationary shielding gas or air, moving (blown) shielding gas or air, if necessary followed by a pickling process, wherein the material after this final annealing process on foil strips is annealed out or/and has a grain size of smaller than 70 μm.

Likewise it is conceivable that hydrogen or a hydrogen/nitrogen mixture or argon or a mixture of these gases is used as the shielding gas for the final annealing of the foil strips.

Furthermore, the annealing under shielding gas can be carried out with several holding times from 1 second to 5 hours at various temperatures between 600° C. and 1200° C.

It is of particular advantage if the hot-forming is interrupted and then a laminated metal bundle is produced by stacking of two or more of these products rolled in this way, wherein the laminated bundle is welded all around, after which the laminated bundle is hot-worked by mechanical deformation, such as rolling, for example, wherein the thickness of the bundle is reduced by the factor of 1.5 to 200 by this mechanical deformation, with if necessary one or more intermediate annealings at temperatures between 800 and 1350° C. for 1 hour to 300 hours under air or shielding gas, wherein if necessary the alloying elements of the individual laminations diffuse through one or more interfaces of the laminated bundle into the neighboring laminations, after which the bundle is cold-worked to a final thickness of 10 to 300 μm with a degree of deformation of greater than 90%, wherein at least one of the outer bundle layers of the overall bundle has a texture.

The welded laminated bundle can have a length between 0.1 and 20 m and a width between 0.1 and 5 m.

Alternatively, it is also conceivable, after the hot-forming and pickling and/or after an interruption of the cold-forming, to stack two or more primary products (hot-formed, cold-formed or a mixture of both) to a bundle, wherein the thickness of the individual primary products is between 100 mm and 0.08 mm, the primary products are cut into strips of at least 10 mm if necessary before the stacking, the primary products are degreased if necessary, followed if necessary by one or more treatments to increase the roughness of the surface of the individual layers, such as brushing and/or grinding, for example, after which the bundle is cold-worked to a final thickness of 10 to 300 μm with a degree of deformation of greater than 90%, wherein the alloying elements of the individual tapes diffuse if necessary through one or more interfaces of the tape bundles into the neighboring tapes during the annealing(s), wherein at least one of the outer bundle layers of the overall bundle has a texture.

Furthermore, during the production of the bundle by stacking of two or more hot-formed or cold-formed products from alloys according to the invention, one or more of these layers stacked as the bundle can be replaced by a metallic material with a different alloy composition, wherein at least one of the outer layers of the bundle still consists of an alloy according to the invention.

Beyond this, one or more of these layers stacked as the bundle can then also be replaced by a layer comprising a Cu—Ni alloy with further alloying elements if necessary or by a layer comprising an Ni—Cr alloy or an Ni—Cr—Fe alloy with an Ni content of at least 5% and if necessary further alloying elements, wherein at least one of the outer layers of the bundle still consists of an alloy according to the invention.

Beyond this, one or more of these layers stacked as the bundle can then also be replaced by a layer comprising a Cu—Ni alloy with 0 to 12% of different alloying elements or by a layer comprising an Ni—Cr alloy or an Ni—Cr—Fe alloy with an Ni content of at least 5% and 0 to 12% of further alloying elements, wherein at least one of the outer layers of the bundle still consists of an alloy according to the invention.

Beyond this, one or more of these layers stacked as the bundle can then also be replaced by an oxide layer or by a nitride layer or by an adhesive layer, wherein at least one of the outer layers of the bundle still consists of an alloy according to the invention.

It is advantageous in this connection if the mean grain size at the textured surface is equal to or smaller than twice the thickness of the top layer.

The metal foil produced in this way is used for the coating with high-temperature superconducting oxide layers, especially oxides, if necessary with one or more buffer layers.

The method according to the invention for the production of metal foils will be explained by the following examples:

For the production of metal foils, an alloy was produced on industrial scale in an amount of more than 5 metric tons in the vacuum induction furnace and then cast into ingots.

Table 1 presents the analysis (in wt %) of an alloy produced on industrial scale according to the invention and cast as ingot.

The ingot was then hot-rolled at temperatures between 600° C. and 1250° C. to a primary product with a final thickness of the primary product between 2 and 10 mm and a mean grain size of 5 to 50 μm, wherein the thickness of this material was reduced by the factor of 50 to 200. Then the primary product was pickled and thereafter cold-rolled with a degree of deformation of more than 90% to 0.08 mm thickness, wherein the cold-rolling was interrupted at an intermediate dimension between 0.5 and 5 mm thickness and additionally an annealing was performed on the intermediate product at a temperature between 600° C. and 1200° C. and with an annealing duration of 10 seconds to 100 minutes. Then the foil has a mean grain size smaller than 70 μm. The 0.08 mm thick foil produced in this way was then cut into strips with different strip widths of 10 to 200 mm.

A partial amount of the 10 mm to 200 mm wide metal foil strips was thereafter annealed in one continuous furnace (furnace 1), a further partial amount in another continuous furnace (furnace 2) under hydrogen at temperatures between 750° C. and 1100° C. for 5 minutes to 60 minutes. The foils were then investigated metallographically as to whether they were recrystallized and which grain size they had.

Table 2 presents results from these investigations as examples.

TABLE 2

| Furnace | Annealing temperature | Annealing duration | Re-crystallization | Mean grain size |
|---|---|---|---|---|
| 1 | 750-850° C. | 1 to 15 minutes | incomplete | not determined |
| 1 | 850-950° C. | 1 to 15 minutes | incomplete | not determined |
| 1 | 900-1000° C. | 1 to 15 minutes | complete | 14 μm |
| 2 | 900-1000° C. | 5 to 20 minutes | complete | 10 μm |
| 2 | 950-1100° C. | 5 to 20 minutes | complete | 15 μm |
| 2 | 950-1100° C. | 5 to 20 minutes | complete | 15 μm |

The examples, the results of which are summarized in Tables 1 and 2, show that metal foils are producible in amounts of more than one metric ton according to the described method and can be annealed according to the described method, so that the metal-foils are recrystallized and exhibit a mean grain size of smaller than 70 μm.

Beyond this, for the production of metal foils, a further alloy was produced on industrial scale in an amount of 18 metric tons in the vacuum induction furnace and then cast into electrodes. An ingot was produced from one electrode by remelting by means of VAR.

Table 3 presents the analysis (in wt %) that was determined at three different places in the ingot of this alloy produced on industrial scale according to the invention.

TABLE 1

| Chemical composition (weight %) | | | | | | | | | | |
|---|---|---|---|---|---|---|---|---|---|---|
| Alloy | Ni | Co | Cu | Mo | W | Cr | Nb | Si | C | S | Mg |
| 1 | 85.6 | 0.01 | <0.01 | <0.01 | 14.30 | <0.01 | <0.001 | 0.02 | 0.004 | <0.002 | 0.003 |

| Chemical composition (weight %) | | | | | | | | | |
|---|---|---|---|---|---|---|---|---|---|
| Alloy | Ca | Al | Ti | Fe | Mn | O | N | B | P |
| 1 | <0.001 | <0.005 | <0.01 | 0.05 | <0.01 | 0.003 | <0.002 | <0.001 | 0.002 |

TABLE 3

| Samples of alloy 2 | Chemical composition (weight %) | | | | | | | | | | |
|---|---|---|---|---|---|---|---|---|---|---|---|
| | Ni | Co | Cu | Mo | W | Cr | Nb | Si | C | S | Mg |
| 1 | 85.8 | 0.01 | <0.01 | <0.01 | 14.1 | <0.01 | 0.001 | 0.02 | 0.002 | <0.0005 | 0.002 |
| 2 | 85.3 | 0.01 | <0.01 | <0.01 | 14.6 | <0.01 | 0.005 | 0.02 | 0.002 | <0.0005 | 0.003 |
| 3 | 85.8 | 0.01 | <0.01 | <0.01 | 14.1 | <0.01 | 0.001 | 0.02 | 0.002 | <0.0005 | 0.002 |

| Samples of alloy 2 | Chemical composition (weight %) | | | | | | | | |
|---|---|---|---|---|---|---|---|---|---|
| | Ca | Al | Ti | Fe | Mn | O | N | B | P |
| 1 | 0.001 | <0.005 | <0.01 | 0.02 | <0.01 | 0.001 | <0.001 | <0.001 | 0.002 |
| 2 | 0.001 | <0.005 | <0.01 | 0.02 | <0.01 | 0.001 | <0.001 | <0.001 | 0.002 |
| 3 | 0.001 | <0.005 | <0.01 | 0.02 | <0.01 | 0.001 | <0.001 | <0.001 | 0.002 |

The remelted ingot produced in this way was then hot-rolled at temperatures between 600° C. and 1250° C. to a thickness between 2 and 10 mm, wherein the thickness of this material was reduced by the factor of 50 to 200 process. Samples were taken from this primary product and a mean grain size between 5 and 60 µm was determined for the primary product. Then the primary product was pickled and thereafter cold-rolled with a degree of deformation of more than 90% to 0.06 mm thickness. This rolling was interrupted at an intermediate dimension between 0.5 and 5 mm thickness in order to remove a partial amount of a primary product, and then this partial amount was additionally subjected to an annealing under shielding gas at a temperature between 700° C. and 1200° C. with an annealing duration between 10 seconds and 100 minutes and then further cold-rolled to 0.06 mm. The 0.06 mm thick foils produced in this way (with or without intermediate annealing) were then cut into strips with different strip widths of 10 to 280 mm.

Then a partial amount of the foil strips was annealed in two different continuous furnaces (in the already used furnace 1 and one further furnace 3) at temperatures between 600° C. and 1200° C. for 4 minutes to 250 minutes in hydrogen or in an argon/hydrogen mixture.

Thereafter the 10 mm to 280 mm wide strips were investigated by means of the known EBSD technique (electron backscattering diffraction) as to which % of the investigated foil-strip surfaces exhibited a cubic texture (percentage cubic texture) in which the cubic grains were not misoriented by more than 10° from the ideal cubic texture, wherein ideal means that these grains with cubic texture lie exactly parallel to the foil surface, i.e. are not tilted out of the plane, and that the grains are not rotated relative to one another in the plane.

Table 4 presents results from these EBSD measurements as examples. Beyond this, the samples were also investigated metallographically: the samples are recrystallized and have a mean grain size between 10 and 40 µm.

These examples, the results of which are summarized in Tables 3 and 4, show that metal foils are producible in amounts of more. than one metric ton with the described method and can then be annealed according to the described method, so that the metal-foil strips are recrystallized and exhibit a large proportion of cubic texture.

Before the annealing No. 4 in furnace 3 in Table 4, a second partial amount for another annealing was taken from the foil-strip amount that existed before this annealing 4 and a partial amount of which was used for annealing 4, wherein this second partial amount was annealed with another method, which is described as follows: the foil strips were annealed in a batch furnace at temperatures between 600° C. and 1200° C. for at least 5 minutes and at most 250 minutes under an argon/hydrogen mixture. The annealing was carried out in such a way that the foil strips were heated to the temperature range between 600° C. and 1200° C. with a heating rate between 1° C. per minute and 1000° C. per minute. and were cooled from the temperature range between 600° C. and 1200° C. with a cooling rate between 1000° C. per minute and 0.1° C. per minute. Then the foil strips were investigated by means of the known EBSD technique (electron backscattering diffraction) as to which % of the investigated foil-strip surfaces exhibited a cubic texture (percentage cubic texture) in which the cubic grains were not misoriented by more than 10° from the ideal cubic texture, wherein ideal means that these grains with cubic texture lie exactly parallel to the foil surface, i.e. are not tilted out of the plane, and that the grains are not rotated relative to one another in the plane. In this measurement after the described batch annealing, the foil strips exhibited a proportion of cubic texture of more than 99% (10° misorientation). With this more than 99% (10° misorientation), the proportion of cubic texture after this batch annealing is comparably high relative to the result of the continuous annealing (annealing No. 4 with 97% proportion of cubic texture (10° misorientation)). Beyond this, the samples were also investigated metallographically: The

TABLE 4

| Furnace | Annealing | Annealing temperature(s) | Annealing atmosphere | Annealing duration | % cubic texture (10° misorientation) |
|---|---|---|---|---|---|
| 1 | 1 | 750° C.-950° C. | Hydrogen | 1-15 minutes | 32% |
| 1 | 2 | Two-zone annealing 750° C.-950° C./1000° C.-1200° C. | Hydrogen | 5-20 minutes | 37% |
| 1 | 3 | Two-zone annealing 750° C.-950° C./1000° C.-1200° C. | Hydrogen | 5-20 minutes | 53% |
| 3 | 4 | 600° C.-1200° C. | Argon/hydrogen mixture | 5-250 minutes | 97% | samples that were annealed in the batch as described are recrystallized and have a mean grain size between 10 and 50 µm. The mean grain size of these samples annealed in the batch is therefore comparable with the mean grain size of the samples after the continuous annealing (10 to 40 µm).

Therefore it was possible to show by these comparison experiments (batch annealing/continuous annealing) that the method according to the invention, with suitable selection of the parameters, is able to yield the same results as material that was annealed in the batch instead of in the continuous process. The following examples may therefore be transferred to the method according to the invention:

A partial amount of foil strips of alloy 1 with the foil thickness of 0.08 mm and the strip width between 10 and 200 mm was annealed in a batch furnace at temperatures between 600° C. and 1190° C. and an annealing duration between 30 minutes and 100 hours in hydrogen, wherein heating to the temperature range between 600° C. and 1190° C. was carried out with a heating rate between 1° C. per minute and 2000° C. per minute and wherein cooling from the temperature range between 600° C. and 1190° C. was carried out with a cooling rate between 2000° C. per minute and 0.1° C. per minute.

Then the strips were investigated by means of the known EBSD technique (electron backscattering diffraction) as to which % of the investigated foil-strip surfaces exhibited a cubic texture (percentage cubic texture) in which the cubic grains were not misoriented by more than 10° from the ideal cubic texture, wherein ideal means that these grains with cubic texture lie exactly parallel to the foil surface, i.e. are not tilted out of the plane, and that the grains are not rotated relative to one another in the plane.

Results of these EBSD measurements are listed as examples in Table 5. Beyond this, the samples were also investigated metallographically: the samples are recrystallized and have a mean grain size between 10 and 60 µm.

TABLE 5

| Annealed samples from alloy 1 | Metal foil thickness | Percentage cubic texture (10°) |
|---|---|---|
| 1 | 0.08 mm | 82% |
| 2 | 0.08 mm | 86% |
| 3 | 0.08 mm | 91% |
| 4 | 0.08 mm | 88% |
| 5 | 0.08 mm | 98% |
| 6 | 0.08 mm | 71% |

Furthermore, a partial amount of strips from alloy 2 was likewise annealed in a batch furnace at temperatures between 600° C. and 1190° C. for at least 15 minutes and at most 72 hours under shielding gas, wherein nitrogen was used up to temperatures of 700/800° C. and from 700/800° C. on nitrogen was replaced by hydrogen. A partial amount of the foil strips was annealed in an argon/5% hydrogen mixture. The annealings were carried out in such a way that the foil strips were heated into the temperature range between 600° C. and 1190° C. with a heating rate between 1° C. per minute and 2000° C. per minute and were cooled from the temperature range between 600° C. and 1190° C. with a cooling rate between 2000° C. per minute and 0.1° C. per minute.

Then, for the determination of the foil-strip properties, the volume fraction of the cubic texture of the foil strips annealed in this way was determined by means of x-ray diffractometer measurements using the known method for the determination of the orientation distribution of the crystallites (orientation distribution function "OVF" or "ODF"), wherein a deviation of at most 5° around the ideal alignment of the cubic grains was used to determine the volume of the cubic texture (percentage cubic texture).

The results are summarized in Table 6. Moreover, the samples were investigated metallographically, with the result that the samples are recrystallized and a mean grain size of the annealed foil strips between 20 and 40 µm was determined.

TABLE 6

| Coating | Annealing | Alloy 2 with intermediate annealing during cold-rolling Percentage cubic texture (5°) | Alloy 2 without intermediate annealing during cold-rolling Percentage cubic texture (5°) |
|---|---|---|---|
| without coating | 1 | no measurement possible, since the foils were stuck together | |
| MgO powder by means of adhesive | 2 | 65 | 65 |
| MgO powder | 3 | 62.4 | — |
| | 4 | 70.8 | 68 |
| | 5 | 71.4 | — |
| | 6 | 62.8 | 75 |
| | 7 | 72.2 | 69 |
| | 8 | 76.6 | 65 |
| | 9 | 60.4 | 63 |
| | 10 | — | 72 |
| | 11 | 72.4 | 67 |
| | 12 | 79.2 | 74 |
| | 13 | 66 | 60 |
| | 14 | — | 82 |
| | 15 | — | 54 |

As an example, a partial amount of 10 mm to 200 mm wide foil strips was annealed in hydrogen in a batch furnace and a further partial amount was annealed in an argon/5% hydrogen mixture as described above and the foils were then investigated by means of the known EBSD technique (electron backscattering diffraction) as to which % of the investigated foil-strip surfaces exhibited a cubic texture (percentage cubic texture) in which the cubic grains were misoriented by not more than 10° from the ideal cubic texture.

Results of these EBSD measurements are listed as examples in Table 7.

TABLE 7

| Sample from alloy 2 | Annealing | Annealing atmosphere | Percentage cubic texture (10°) |
|---|---|---|---|
| 1 | 1 | Hydrogen | 97% |
| 2 | 2 | Hydrogen | 96% |
| 3 | 3 | Hydrogen | 97% |
| 4 | 4 | Argon/5% hydrogen | 99.7% |
| 5 | 5 | Argon/5% hydrogen | 99% |
| 6 | 6 | Argon/5% hydrogen | 99.9% |

These examples, which are summarized in the Tables 5 to 7, show that it is possible to produce metal foils on industrial scale according to the described method and then it is possible to anneal them according to the method adequate for the invention, so that the metal-foil strips are recrystallized and exhibit a large proportion of cubic texture.

Beyond this, the production of the metal foil from alloy 2 was interrupted, after the hot-rolling as described above, during the cold-rolling as described above, and specifically at a thickness of the primary product between 1 mm and 0.05 mm. A partial amount was removed and cold-rolled with polished rolls to final thickness of 0.06 mm. Thereafter the roughness of the surface of the 0.06 mm thick foil was investigated and values smaller than 1 μm were detected. The proportion of cubic texture was not decreased by this rolling with polished rolls.

The recrystallized metal foils from alloy 1 and alloy 2 produced and annealed in this way were coated with one or more buffer layers and the high-temperature superconducting layer of YBCO. By means of inductive measurement, it was possible to measure a critical current of at least 50 A at 77 K on these coated products. These examples therefore show that, with this method, it was possible to produce metal foils that are suitable for the coating with buffer and superconducting layers and thus it was possible to produce a superconducting product.

Beyond this, the production of the metal foils from alloy 2 after the hot-rolling as described above during the cold-rolling as described above was interrupted at a product thickness between 1 mm and 0.1 mm. A partial amount of this intermediate product was removed for the production of a bundle stack, wherein this removed intermediate product from alloy 2 was applied as a top layer on exactly one other hot-formed product of a different alloy (support layer).

Three different alloys (alloy 3, alloy 4, alloy 5), the analyses of which are presented in Table 8, were used as the support layer.

TABLE 8

| Alloy | C | S | Cr | Ni | Mn | Si | Ti | Cu | Fe | P | Al |
|---|---|---|---|---|---|---|---|---|---|---|---|
| Alloy 3 | 0.04 | 0.003 | 16.4 | Rest | 0.2 | 0.4 | 0.2 | 0.01 | 9.37 | 0.008 | 0.14 |
| Alloy 4 | 0.05 | 0.002 | 22.9 | Rest | 0.7 | 0.2 | 0.4 | 0.02 | 14.58 | 0.008 | 1.35 |
| Alloy 5 | 0.04 | 0.003 | 19.6 | Rest | 0.4 | 1.3 | <0.1 | <0.01 | 0.18 | 0.002 | 0.12 |

These support layers of alloys 3 to 5 were produced by means of melting, casting in ingots and hot-forming in the temperature range between 600° C. and 1300° C. to a thickness between 4.5 mm and 5.5 mm. Then the surfaces of the support foils being used and also the surfaces of the top-layer foils of alloy 2 being used were ground then roughened by means of brushing and degreased. Before the stacking, the primary products were cut into 10 mm to 200 mm wide metal-foil strips. Thereafter the bundle was formed from them by stacking as presented in Table 9 (material of top layer and material of support layer). The respective bundle was cold-worked to a final thickness between 10 μm and 300 μm, wherein firstly cold-rolling to an intermediate thickness between 1.5 and 2.5 mm and then an annealing of the intermediate product in the temperature range between 600° C. and 1300° C. for an annealing duration of 1 to 90 minutes under argon were then performed. This heat treatment permits interdiffusion between the two original layers, whereby a strong bond is formed between the original top layer and the original support layer. Then the intermediate product was cold-rolled to a final thickness between 70 and 300 μm, wherein the bundle was deformed with a degree of deformation of greater than 90%. Thereafter the 10 mm to 200 mm wide metal strips were annealed in a batch furnace at temperatures between 600° C. and 1150° C. and an annealing duration between 30 minutes and 100 hours under an argon/hydrogen mixture, wherein heating to the temperature range between 600° C. and 1190° C. was carried out with a heating rate between 1° C. per minute and 2000° C. per minute and cooling from the temperature range between 600° C. and 1190° C. was carried out at a cooling rate between 2000° C. per minute and 0.1° C. per minute. The strips were then detached and unrolled and investigated as follows: by means of metallographic ground sections, the mean grain size of the top layer and the bonding of the layers (top layer and support layer) to one another were investigated on the respective produced final products, and the percentage cubic texture of the top layer (up to 10° misorientation from the ideal cubic texture) was determined by means of the known EBSD technique. The metallographic investigations show that, after cold-working to final thickness, all investigated products exhibit good bonding to one another without detachment of the individual layers and that the top layer is recrystallized.

Results of the investigations are presented as examples in Table 9.

TABLE 9

| Material of top layer | Material of support layer | Thickness of the support layer (before bundle formation) | Thickness of plated bond (intermediate product) | Thickness after cold-rolling (final product) | Thickness of the top layer of alloy 2 (final product) | Mean grain diameter of the top layer of alloy 2 (final product) | Percentage cubic texture (10°) (top layer of final product) |
|---|---|---|---|---|---|---|---|
| Alloy 2 | Alloy 3 | 4.9 mm | 1.6 mm | 75 μm | 8 μm | 19 μm | 20-42% |
| Alloy 2 | Alloy 3 | 4.9 mm | 1.6 mm | 124 μm | 11 μm | 19 μm | 72-81% |
| Alloy 2 | Alloy 4 | 4.9 mm | 2.0 mm | 123 μm | 11 μm | 18 μm | 75-81% |
| Alloy 2 | Alloy 5 | 5.1 mm | 2.1 mm | 129 μm | 11 μm | 18 μm | 91-92% |

For the bundle comprising alloy 2/alloy 5 with a top-layer thickness of 11 μm, a high percentage cubic texture of at least 91% was attained after the annealing. A very thin top layer (final product) in the bundle comprising alloy 2/alloy 3 of 8 μm yields an only slight cubic texture of up to 42% with the method. Thus it was evident that, if the layer thickness of the top material is too small, it was no longer possible to establish the pronounced cubic texture. Only for samples in which the layer thickness of the top layer was clearly greater than half of the mean grain size was it possible with the method according to the invention to produce a sufficiently large proportion of cubic texture of the top layer for coating with superconducting layers.

These examples, which are summarized in Tables 8 and 9, show that metal foils can be produced on the industrial scale according to the described method and that it was then possible to anneal them according to a method adequate for the invention, so that the metal-foil strips are recrystallized and exhibit a high proportion of cubic texture.

The foregoing examples show that the production of metal foils can be achieved on industrial scale with the described method. Beyond this, for cost reasons, further alloys were additionally produced in smaller amounts of less than 50 kg in a laboratory vacuum furnace and cast in ingots as examples for the investigation of the alloying influence. Additions of elements detract from the sharpness of the texture. They do so by forming, at the surface of the metal foil, for example, oxides at the grain boundaries or in the grain, thus hindering the ordered growth behavior on the foil texture containing oxides and superconductors. The amount of the elements available for this mechanism therefore remained greatly reduced even in these alloys on the laboratory scale.

The analyses (in wt %) of the alloy products produced in this way are presented in Table 10.

a mean grain size smaller than 70 μm. The 0.08 mm thick foil produced in this way was thereafter cut into strips with different strip widths of 10 to 50 mm.

The 10 mm to 50 mm wide metal-foil strips were annealed in a batch furnace at temperatures between 600° C. and 1190° C. and an annealing duration between 30 minutes and 100 hours under an argon/5% hydrogen mixture, wherein heating to the temperature range between 600° C. and 1190° C. was carried out with a heating rate between 1° C. per minute and 2000° C. per minute and cooling from the temperature range between 600° C. and 1190° C. was carried out at a cooling rate between 2000° C. per minute and 0.1° C. per minute.

Then the strip surfaces were cleaned and thereafter investigated by means of the known EBSD technique (electron backscattering diffraction) as to which % of the investigated foil-strip surfaces exhibits a cubic texture in which the cubic grains are misoriented by not more than 10° from their ideal cubic texture.

Results from these EBSD measurements and from measurements of the mean grain size of the foil samples are listed as examples in Table 11.

TABLE 10

| Element | LB1 | LB2 | LB3 | LB4 | LB5 | LB6 | LB7 | LB8 | LB9 |
|---|---|---|---|---|---|---|---|---|---|
| C | 0.0006 | 0.0008 | 0.0016 | 0.0012 | <0.002 | 0.005 | 0.002 | 0.002 | 0.002 |
| S | <0.002 | <0.002 | <0.002 | <0.002 | 0.0005 | 0.0005 | 0.001 | 0.002 | <0.001 |
| N | <0.001 | <0.001 | <0.001 | <0.001 | 0.001 | 0.001 | 0.001 | 0.001 | 0.001 |
| Cr | <0.01 | <0.01 | <0.01 | <0.01 | 0.01 | 0.01 | 0.01 | 0.01 | 0.01 |
| Ni | Rest | Rest | Rest | Rest | Rest | Rest | Rest | Rest | Rest |
| W | 20.0 | 24.4 | 20.3 | 24.1 | 14.3 | 14.5 | 13.4 | 13.6 | 13.7 |
| Mn | <0.01 | <0.01 | <0.01 | <0.01 | 0.01 | 0.01 | 0.01 | 0.01 | 0.01 |
| Si | 0.02 | 0.02 | 0.02 | 0.02 | 0.02 | 0.02 | 0.02 | 0.02 | 0.02 |
| Mo | <0.01 | <0.01 | <0.01 | <0.01 | 0.01 | 0.01 | 0.01 | 0.01 | 0.01 |
| Co | <0.01 | <0.01 | 0.01 | 0.01 | 0.01 | 0.01 | 0.01 | 0.01 | 0.01 |
| Ti | <0.01 | <0.01 | <0.01 | <0.01 | 0.01 | 0.01 | 0.01 | 0.01 | 0.04 |
| Nb | <0.001 | <0.001 | <0.001 | <0.001 | <0.001 | <0.001 | <0.001 | <0.001 | <0.001 |
| Ca | <0.001 | <0.001 | <0.001 | <0.001 | <0.001 | <0.001 | <0.001 | <0.001 | <0.001 |
| Cu | <0.01 | <0.01 | <0.01 | <0.01 | 0.01 | 0.01 | 0.01 | 0.01 | 0.01 |
| Fe | 0.01 | 0.01 | 0.01 | 0.01 | 0.01 | 0.01 | 0.01 | 0.01 | 0.01 |
| P | <0.002 | <0.002 | 0.002 | 0.005 | 0.002 | 0.002 | 0.002 | 0.002 | 0.002 |
| Al | <0.005 | <0.005 | 0.005 | <0.005 | 0.005 | 0.005 | 0.005 | 0.005 | 0.005 |
| Mg | 0.008 | 0.004 | 0.005 | 0.005 | 0.0002 | 0.010 | 0.0002 | 0.0002 | 0.0002 |
| B | <0.001 | <0.001 | <0.001 | 0.001 | 0.001 | 0.001 | 0.001 | 0.001 | 0.001 |
| O | 0.007 | 0.011 | 0.01 | 0.013 | 0.009 | 0.002 | 0.016 | 0.004 | 0.01 |

The ingots produced in this way were then annealed at temperatures between 800° C. and 1200° C. under air. Thereafter the annealed ingots were hot-rolled at a temperature between 600° C. and 1250° C. to a thickness between 2 and 8 mm, wherein the thickness of this starting ingot was reduced by the factor of 8 to 12.

The primary products produced in this way by hot-rolling were then pickled and ground and thereafter cold-rolled with a degree of deformation of greater than 90% to 0.08 mm thickness, wherein the cold-rolling was interrupted at an intermediate dimension between 5 mm and 0.07 mm thickness and in addition one or more annealings of the intermediate products were carried out at a temperature between 600° C. and 1200° C. and with an annealing duration of 10 seconds to 100 minutes, partly under nitrogen (temperature lower than 700/800° C.) and partly under hydrogen (temperature higher than 700/800° C.). Thereafter the foils have

TABLE 11

| Alloy | Foil thickness | Annealing | Mean grain size of the foil | % cubic texture Misorientation of max. 10° from ideal cubic texture |
|---|---|---|---|---|
| LB1 | 0.08 mm | 1 | 15 μm | 88.7 |
| LB1 | 0.08 mm | 2 | 16 μm | 89.1 |
| LB1 | 0.08 mm | 3 | 18 μm | 78.6 |
| LB2 | 0.08 mm | 1 | 20 μm | 64.5 |
| LB2 | 0.08 mm | 2 | 18 μm | 54.2 |
| LB2 | 0.08 mm | 3 | 17 μm | 63.8 |
| LB3 | 0.08 mm | 1 | 27 μm | 96.6 |
| LB4 | 0.08 mm | 1 | 25 μm | 91.4 |
| LB5 | 0.08 mm | 4 | 17 μm | 81.2 |
| LB6 | 0.08 mm | 4 | 18 μm | 90.3 |
| LB7 | 0.08 mm | 4 | 17 μm | 89.3 |
| LB8 | 0.08 mm | 4 | 20 μm | 85.8 |
| LB9 | 0.08 mm | 4 | 19 μm | 86.5 |

The examples in Tables 9, 10 and 11 show that, even with a variation of the analysis with elevated W content, a metal foil that is recrystallized and has a high proportion of cubic texture after annealing can be produced with the method adequate for the invention.

The invention claimed is:

1. A method for the production of a metal foil from an alloy with more than 50% nickel comprising (in wt-%):
W 5 to 30%, wherein W can be replaced completely or partly by Mo,
Mg 0.0001-0.050%, wherein Mg can be replaced completely or partly by Ca,
Ni the rest
as well as smelting-related impurities,
the method containing the following method steps:
(a) the alloy is melted in amounts of more than one metric ton in a vacuum induction furnace or openly in an induction or arc furnace, followed by a treatment in a vacuum oxygen decarbonization or a vacuum ladle furnace system,
(b) then the alloy is cast into ingots, electrodes or as continuous casting for the formation of a primary product, followed by a single or multiple remelting by means of vacuum arc remelting and/or an electroslag remelting unit,
(c) thereafter the primary product is annealed at temperatures between 800 and 1350° C. for 1 hour to 300 hours under air or shielding gas,
(d) thereafter the primary product is hot-formed by hot-rolling, at temperatures between 1300 and 600° C., wherein the thickness of the starting material is reduced by the factor of 1.5-200, so that the primary product has a thickness of 1 to 300 mm after the forming and has not been recrystallized and/or recovered and/or has been (dynamically) recrystallized with a grain size smaller than 300 µm,
(e) the primary product is then pickled, wherein the primary product is ground after the hot-rolling and the subsequent pickling,
(f) after the pickling, the primary product is cold-worked with polished rolls to produce a foil having a final thickness of 10 to 300 µm with a degree of deformation of greater than 90% and roughnesses smaller than 2 µm,
(g) after the pickling, the production of the foil having a final thickness of 10 to 300 µm with a degree of deformation greater than 90% takes place by cold-working with intermediate annealings at temperatures between 550° C. and 1200° C. and annealing times between 10 seconds and 100 hours under air or reducing shielding gas, wherein the shielding gas is stationary and is followed by a quenching in the stationary shielding gas or air, moving (blown) shielding gas or air, followed by a pickling process, wherein the material after the final annealing on foil strips is recovered or/and has a grain size of smaller than 70 µm,
(h) subsequent to step (g), the foil is cut into strips of 5 to 300 mm,
(i) the foil strips are then annealed under shielding gas at temperatures between 600 and 1200° C. for 1 second to 5 hours in a continuous furnace to form an annealed foil material,
(j) wherein hydrogen or a hydrogen/nitrogen mixture or argon or a mixture of these gases is used as the shielding gas for the final annealing of the foil strips,
(k) wherein the annealed foil material is recrystallized and exhibits a large proportion of cubic texture after this annealing.

2. The method according to claim 1, wherein the alloy is melted in amounts of more than one metric ton in a vacuum induction furnace or openly in an induction or arc furnace, followed by a treatment in a vacuum oxygen decarbonization or vacuum ladle furnace system, then the alloy is cast into ingots, electrodes or as continuous casting for the formation of a primary product, thereafter the primary product is additionally annealed at temperatures between 800 and 1350° C. for 1 hour to 300 hours under air or shielding gas, followed by a single or multiple remelting by means of vacuum arc remelting and/or an electroslag remelting unit.

3. The method according to claim 1, wherein the primary product is hot-rolled at temperatures between 1300° C. and 600° C., wherein the thickness of the starting material is reduced by the factor of 1.5-200, so that the primary product has a thickness of 1 to 300 mm after the rolling and has not been recrystallized and/or annealed out and/or has been (dynamically) recrystallized with a grain size smaller than 300 µm, thereafter is additionally hot-rolled a 2nd time at temperatures between 1300° C. and 600° C. after an annealing at temperatures between 800 and 1350° C. for 1 hour to 300 hours under air or shielding gas, wherein the thickness of the starting material is reduced by the factor of 1.5 to 200 and after the last rolling has a thickness of 1 to 100 mm and has not been recrystallized and/or has been annealed out and/or has been (dynamically) recrystallized with a grain size smaller than 300 µm.

4. The method according to claim 1, wherein the annealing of step (i) is carried out with several holding times at various temperatures.

5. The method according to claim 1, wherein the hot-forming is interrupted and then a laminated metal bundle is produced by stacking of two or more of the primary products in laminated bundle layers, wherein the laminated bundle is welded all around, after which the laminated bundle is hot-worked by mechanical deformation, wherein the thickness of the laminated bundle is reduced by the factor of 1.5 to 200 by this mechanical deformation, with one or more intermediate annealings at temperatures between 800 and 1350° C. for 1 hour to 300 hours under air or shielding gas, wherein the alloying elements of the individual laminations diffuse through one or more interfaces of the laminated bundle into the neighboring laminations, after which the laminated bundle is cold-worked to a final thickness of 10 to 300 µm with a degree of deformation of greater than 90%, wherein at least one of the outer laminated bundle layers of the overall laminated bundle has a texture.

6. The method according to claim 1, wherein after the hot-forming and pickling and/or after an interruption of the cold-working, two or more primary products (hot-formed, cold-worked or a mixture of both) are stacked in individual layers forming a bundle, wherein the thickness of the individual primary products is between 100 mm and 1 mm, the primary products are cut into strips of 10 mm before the stacking, the primary products are degreased, followed by one or more treatments of brushing and/or grinding to increase the roughness of the surface of the individual layers, after which the bundle is cold-worked to a final thickness of 10 to 300 µm with a degree of deformation of greater than 90%, wherein the alloying elements of the strips diffuse through one or more interfaces of the bundle into neighboring strips during the annealing(s), wherein at least one of the outer bundle layers of the overall bundle has a texture.

7. The method according to claim 6, wherein during the production of the bundle by stacking of two or more hot-formed or cold-worked products from alloys consisting of (in wt %)

W 5 to 30%, wherein W can be replaced completely or partly by Mo,

Mg 0.0001-0.050%, wherein Mg can be replaced completely or partly by Ca

Ni the rest as well as smelting-related impurities, one or more of the layers stacked as the bundle is (are) replaced by a metallic material with a different alloy composition, wherein at least one of the outer layers of the bundle still consists of an alloy consisting of (in wt %)

W 5 to 30%, wherein W can be replaced completely or partly by Mo,

Mg 0.0001-0.050%, wherein Mg can be replaced completely or partly by Ca

Ni the rest as well as smelting-related impurities.

8. The method according to claim 6, wherein during the production of the bundle by stacking of two or more hot-formed or cold-worked products from alloys consisting of (in wt %)

W 5 to 30%, wherein W can be replaced completely or partly by Mo,

Mg 0.0001-0.050%, wherein Mg can be replaced completely or partly by Ca

Ni the rest as well as smelting-related impurities, one or more of the layers stacked as the bundle is (are) replaced by a layer comprising a Cu—Ni alloy with further alloying elements or by a layer comprising an Ni—Cr or an Ni—Cr—Fe alloy with an Ni content of at least 5% and further alloying elements, wherein at least one of the outer layers of the bundle still consists of an alloy consisting of (in wt %)

W 5 to 30%, wherein W can be replaced completely or partly by Mo if necessary,

Mg 0.0001-0.050%, wherein Mg can be replaced completely or partly by Ca

Ni the rest as well as smelting-related impurities.

\* \* \* \* \*